US009774339B2

(12) United States Patent
Sun et al.

(10) Patent No.: US 9,774,339 B2
(45) Date of Patent: Sep. 26, 2017

(54) STATISTICAL ESTIMATION-BASED NOISE REDUCTION TECHNIQUE FOR LOW POWER SUCCESSIVE APPROXIMATION REGISTER ANALOG-TO-DIGITAL CONVERTERS

(71) Applicant: Board of Regents, The University of Texas System, Austin, TX (US)

(72) Inventors: Nan Sun, Austin, TX (US); Long Chen, Austin, TX (US); Xiyuan Tang, Austin, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 0 days.

(21) Appl. No.: 15/278,519

(22) Filed: Sep. 28, 2016

(65) Prior Publication Data
US 2017/0093414 A1    Mar. 30, 2017

Related U.S. Application Data
(60) Provisional application No. 62/233,683, filed on Sep. 28, 2015.

(51) Int. Cl.
*H03M 1/08* (2006.01)
*H03M 1/04* (2006.01)
(Continued)

(52) U.S. Cl.
CPC .............. *H03M 1/08* (2013.01); *H03M 1/04* (2013.01); *H03M 1/0697* (2013.01);
(Continued)

(58) Field of Classification Search
None
See application file for complete search history.

(56) References Cited

U.S. PATENT DOCUMENTS 5,675,340 A * 10/1997 Hester .................... H03M 1/06
341/118
6,617,899 B2 * 9/2003 Cyrusian ............. H03K 5/2481
327/199
(Continued)

OTHER PUBLICATIONS

DeVito et al. An Improved ADC-Error-Correction Scheme Based on a Bayesian Approach, IEEE Transactions on Instrumentation and Measurement, vol. 57, No. 1, Jan. 2008.*
(Continued)

*Primary Examiner* — Howard Williams
(74) *Attorney, Agent, or Firm* — Meunier Carlin & Curfman LLC

(57) ABSTRACT

Disclosed herein are systems and methods that describe statistical estimation based noise reduction for SAR ADCs. For SAR ADCs, the conversion error can be available at the comparator input. Although a noisy 1-bit comparator may not be able to produce an accurate estimation for its input if used only once, the comparison can be repeated multiple times for a designated bit of the multi-bit SAR ADC. This can allow for the improvement of the estimation accuracy by examining the probability of the comparator output being "1" or "0". The estimation of a signal from a noisy environment using multiple trials can be cast as a classic statistical estimation issue. In one aspect of the disclosure, an optimal Bayes estimator is disclosed to achieve a low estimation error from the comparator on a designated bit of the multi-bit SAR ADC.

20 Claims, 8 Drawing Sheets

(51) Int. Cl.
*H03M 1/06* (2006.01)
*H03M 1/10* (2006.01)
*H03M 1/38* (2006.01)
*H03M 1/46* (2006.01)

(52) U.S. Cl.
CPC ........... *H03M 1/1009* (2013.01); *H03M 1/38* (2013.01); *H03M 1/468* (2013.01)

(56) References Cited

U.S. PATENT DOCUMENTS

| | | | | |
|---|---|---|---|---|
| 7,605,738 B2* | 10/2009 | Kuramochi | ......... | H03M 1/0643 341/155 |
| 7,701,256 B2* | 4/2010 | Hurrell | ............... | H03F 3/45188 327/336 |
| 8,004,449 B2* | 8/2011 | Yoshioka | ............... | H03M 1/002 341/150 |
| 2011/0102217 A1 | 5/2011 | Hsu | | |
| 2014/0008515 A1 | 1/2014 | Wang et al. | | |
| 2014/0210653 A1* | 7/2014 | Harpe | ..................... | H03M 1/02 341/110 |
| 2015/0091744 A1 | 4/2015 | Kapusta et al. | | |

OTHER PUBLICATIONS

International Search Report and Written Opinion issued in International Application No. PCT/US2016/054117.

Harpe, et al., "A 10b/12b 40 kS/s SAR ADC with data-driven noise reduction achieving up to 10.1b ENOB at 2.2 fJ/conversion-step", IEEE JSSC, 2013, vol. 48, pp. 3011-3018.

Harpe, et al., "An oversampled 12/14b SAR ADC with noise reduction and linearity enhancements achieving up to 79.1dB SNDR", IEEE ISSCC, 2014, pp. 194-195.

Tai, et al., "A 3.2fJ/c.-s. 0.35V 10b 100kS/s SAR ADC in 90nm CMOS", IEEE VLSI Symp., 2012, pp. 92-93.

* cited by examiner

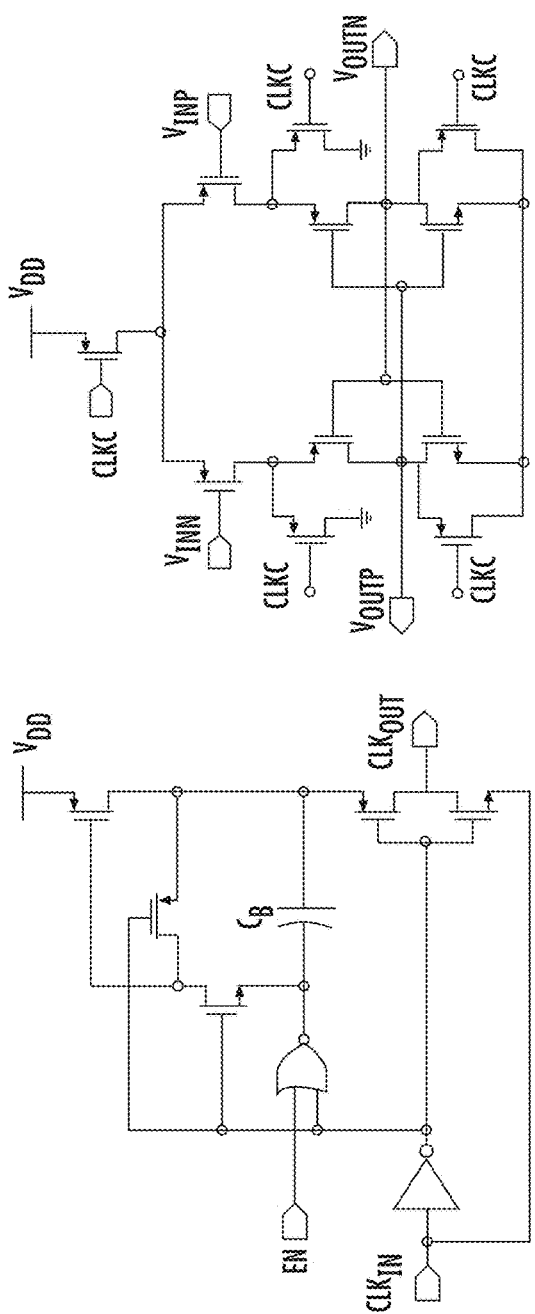
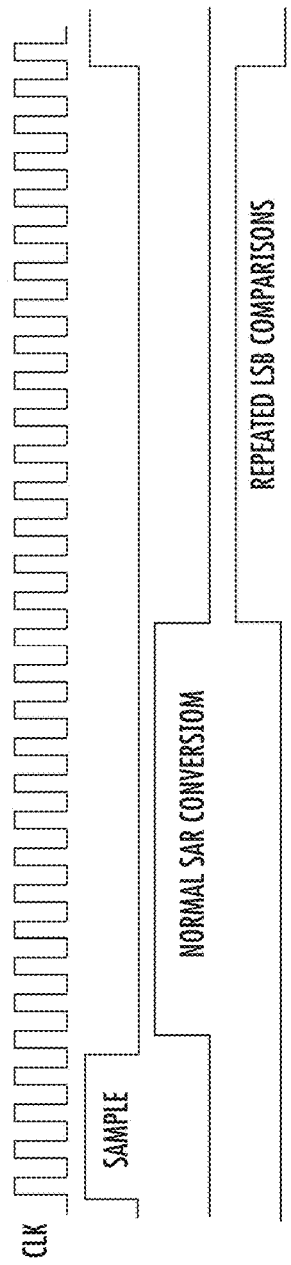
FIG. 3A
FIG. 3B
FIG. 3C

STATISTICAL ESTIMATION-BASED NOISE REDUCTION TECHNIQUE FOR LOW POWER SUCCESSIVE APPROXIMATION REGISTER ANALOG-TO-DIGITAL CONVERTERS

CROSS REFERENCE TO RELATED APPLICATIONS

This application claims priority to and benefit of U.S. provisional patent application Ser. No. 62/233,683 filed Sep. 28, 2015, which is fully incorporated by reference and made a part hereof.

BACKGROUND

Analog-to-digital converters (commonly referred to as ADCs, A/Ds, or A to Ds) can refer to devices that convert a continuous physical quantity (such as voltage) to a digital number that can represent the quantity's amplitude. The result can be a sequence of digital values that have been converted from a continuous-time and continuous-amplitude analog signal to a discrete-time and discrete-amplitude digital signal. Additionally, the conversion can involve quantization of the input that can lead to the introduction of a small amount of error.

Quantization error can refer to the noise introduced by quantization in an ideal ADC. It can refer to a rounding error between the analog input voltage to the ADC and the output digitized value. These errors can be measured in a unit called the least significant bit (LSB). For example, in an eight-bit ADC, an error of one LSB is $1/256$ of the full signal range, or about 0.4%.

The dynamic range of an ADC can be summarized in terms of its effective number of bits (ENOB). ENOB can refer to the number of bits of each measure the ADC returns that are, on average, not noise. An ideal ADC can have an ENOB equal to its resolution.

A successive-approximation register (SAR) ADC can refer to an ADC that uses a comparator to successively narrow a range that contains the input voltage. At each successive step, the converter can compare the input voltage to the output of an internal digital to analog converter (commonly referred to as a DAC, D/C, or D to A), which can represent the midpoint of a selected voltage range. At each step in this process, the approximation can be stored in a successive approximation register (SAR) or other type of memory.

For example, consider an input voltage of 6.3 V and an initial range of 0 to 16 V. For the first step, the input 6.3 V is compared to 8 V (the midpoint of the 0-16 V range). The comparator reports that the input voltage is less than 8 V, so the SAR and/or memory in cooperation with SAR logic circuitry can be updated to narrow the range to 0-8 V. For the second step, the input voltage is compared to 4 V (midpoint of 0-8). The comparator can then report that the input voltage is above 4 V, so the SAR and/or memory in cooperation with SAR logic circuitry can be updated to reflect the input voltage is in the range 4-8 V. For the third step, the input voltage can be compared with 6 V (halfway between 4 V and 8 V); the comparator can report the input voltage is greater than 6 volts, and the search range becomes 6-8 V. The steps can be continued until the desired resolution is reached.

Low resolution SAR ADCs (i.e. those having an ENOB less than 10 bits) can achieve high power efficiencies. However, it can be hard to maintain such high efficiency when extending the ENOB beyond 10 bits. One reason can be that high-resolution ADCs are thermal noise limited, and every 1-bit reduction in thermal noise may require approximately 4 times the analog power, leading to a poorer figures-of-merit (FOMs).

The noise in a high-resolution SAR ADC can be dominated by the comparator. Some techniques have been developed to reduce comparator noise without significantly increasing comparator power. One technique can be to arrange two comparators where a low power coarse comparator can be used on the MSB bits and a high power fine comparator can be used for the last two LSB comparisons. However, this may require that the offsets of the two comparators to be tightly matched, which can be a nontrivial situation at high resolution, even if the comparators are calibrated.

Another technique can involve a data driven noise reduction approach, where one comparator can be fired multiple times when the comparator input is small and the final decision can be made via majority voting. This technique, however, can require a carefully tuned metastability detector that can result in increased design complexity.

Yet another technique can combine redundancy with averaging. Its merit can be that it can also correct DAC settling errors. However, it may require more number of comparison cycles and additional DAC control logic. Besides, as will be shown in details in the detailed description, the SNR improvement using simple averaging may be limited in other respects.

Therefore, what are needed are devices, systems and methods that overcome challenges in the present art, some of which are described above.

SUMMARY

Disclosed herein are systems and methods that describe statistical estimation based noise reduction for SAR ADCs. For SAR ADCs, the conversion error can be available at the comparator input. Although a noisy 1-bit comparator may not be able to produce an accurate estimation for its input if used only once, the comparison can be repeated multiple times for a designated bit of the multi-bit SAR ADC. This can allow for the improvement of the estimation accuracy by examining the probability of the comparator output being "1" or "0". The estimation of a signal from a noisy environment using multiple trials can be cast as a classic statistical estimation issue. In one aspect of the disclosure, an optimal Bayes estimator is disclosed to achieve a low estimation error from the comparator on a designated bit of the multi-bit SAR ADC.

Some advantages of the disclosed systems and methods are as follows. First, the disclosed systems and methods can be simpler than conventional systems and methods. For example, they may not require an additional comparator with matched offset, an accurately tuned metastability detector, or extra DAC control logic. In some implementations, the systems and methods may not need any substantial change to standard SAR ADC operation except for a step of repeating a designated bit comparison (e.g. the LSB) multiple times. The digital estimation can also be easily implemented using, for example, a pre-computed look-up table. Furthermore, the disclosed systems and methods can suppress not only comparator noise but also quantization error, which may not be possible using prior techniques. Thus, the disclosed systems and methods can relax the resolution requirement for the DAC, which can simplify DAC design.

In addition, the disclosed and methods can be more efficient than previous systems and methods from an informational usage point-of-view. The disclosed systems and methods can make use of more sophisticated statistical analysis of the measured value of a designated bit, while previous systems and methods may only be concerned with whether the number of "1" is more than that of "0" in multiple measurements of the designated bit. Last but not least, the estimation accuracy of the disclosed system and methods using statistical analysis can be higher than systems and methods using basic averaging.

In one aspect a multi-bit output SAR ADC is disclosed. The SAR ADC can include at least one comparator, at least one clock generator, and SAR logic comprising at least one counter and memory. For each bit of the multi-bit output of the SAR ADC, one or more comparators can compare an input voltage to a reference voltage as part of a process to determine a value for the output bit. The multi-bit output can be, for example, a four bit, an eight bit, a sixteen bit, a thirty-two bit, a sixty four bit, or a one-hundred and twenty eight bit, or any other number of bit output SAR ADC. Each output bit can have a corresponding reference voltage. For the designated bits of the multi-bit output, the comparators can compare the input voltage to the designated bit's corresponding reference voltage. The comparison can occur a pre-determined number of times during a number of clock cycles generated by one or more clock generators. Each comparison can generate either a value of either "0" or a "1", and the counters can keep count of the number of "0" or "1" values generated during the clock cycles associated with the designated bit. The count information can be stored in memory. The memory can be built from multiple registers, and can be part of the SAR logic. The SAR logic can perform statistical analysis on the count of the number of the "0" and "1" values generated during the clock cycles for any and all designated bits. This statistical analysis can be used to determine a final value of the designated bit(s) of the multi-bit output.

The multi-bit output can include one of a four bit, an eight bit, a sixteen bit, a thirty-two bit, a sixty-four bit, a one-hundred and twenty eight bit, or any other bit output. The designated bit of the multi-bit output can include the least significant bit (LSB).

The statistical analysis can include Bayes estimation. The Bayes estimation can include a calculation of a posterior probability density function of a conversion residue. The Bayes estimation can be performed using a look-up table.

The at least one counter can keep count of the number of "1" values generated during the clock cycles. The at least one counter can keep count of the number of "0" values generated during the clock cycles.

The clock generator can generate a master clock that can be faster than a sampling rate of the SAR ADC. The multi-bit SAR ADC can implement a synchronous clocking scheme. The synchronous clocking scheme can include a ripple counter-based clock divider.

The multi-bit SAR ADC further can include a capacitive digital-to-analog converter (DAC). The capacitive DAC can include binary-weighted capacitors. The capacitive DAC can include a bidirectional single-side (BSS) switching technique. The capacitive DAC can include redundant capacitors to recover errors originating from the comparator having a large comparator input common-mode variation.

The comparator can include a dynamic latch comparator. The comparator can include a p-type metal-oxide-semiconductor (PMOS) input pair.

The SAR logic can include one or more shift registers. The multi-bit SAR ADC can include complementary metal-oxide-semiconductor (CMOS) technology. The multi-bit SAR ADC can include bottom-plate sampling to sample the input voltage. The multi-bit SAR ADC can include n-type metal-oxide-semiconductor (NMOS) transistors to sample the input voltage.

In another aspect, a method for converting an analog signal to a digital signal using a multi-bit output SAR ADC is described. The method can include: comparing, for each bit of the multi-bit output, an input voltage to a reference voltage to determine a value for an output bit. The comparison can be performed by one or more comparators. Each output bit can have a corresponding reference voltage. The method can further include: comparing, for at least one designated bit of the multi-bit output, the input voltage to the designated bit's corresponding reference voltage a plurality of times during a plurality of clock cycles generated by at least one clock generator. Again, the comparison can be performed by one or more comparators. Each comparison can generate either a value of either "0" or a "1". The method can also include: keeping count of the number of at least one of the "0" or "1" values generated during the clock cycles. The keeping count can be performed by a counter. Finally, the method can include performing statistical analysis on the count of the number of the at least one of the "0" and "1" values generated during the clock cycles to determine a final value of the at least one designated bit of the multi-bit output.

The multi-bit output can be, for example, a four bit, an eight bit, a sixteen bit, a thirty-two bit, a sixty four bit, or a one-hundred and twenty eight bit, or any other number of bit output SAR ADC. Each output bit can have a corresponding reference voltage. For the designated bits of the multi-bit output, the comparators can compare the input voltage to the designated bit's corresponding reference voltage. The comparison can occur a pre-determined number of times during a number of clock cycles generated by one or more clock generators. Each comparison can generate either a value of either "0" or a "1", and the counters can keep count of the number of "0" or "1" values generated during the clock cycles associated with the designated bit. The count information can be stored in memory. The memory can be built from multiple registers, and can be part of the SAR logic. The SAR logic can perform statistical analysis on the count of the number of the "0" and "1" values generated during the clock cycles for any and all designated bits. This statistical analysis can be used to determine a final value of the designated bit(s) of the multi-bit output.

The multi-bit output can include one of a four bit, an eight bit, a sixteen bit, a thirty-two bit, a sixty-four bit, a one-hundred and twenty eight bit, or any other bit output. The designated bit of the multi-bit output can include the least significant bit (LSB).

The statistical analysis can include Bayes estimation. The Bayes estimation can include a calculation of a posterior probability density function of a conversion residue. The Bayes estimation can be performed using a look-up table.

The at least one counter can keep count of the number of "1" values generated during the clock cycles. The at least one counter can keep count of the number of "0" values generated during the clock cycles.

The clock generator can generate a master clock that can be faster than a sampling rate of the SAR ADC. The multi-bit SAR ADC can implement a synchronous clocking scheme. The synchronous clocking scheme can include a ripple counter-based clock divider.

The multi-bit SAR ADC further can include a capacitive digital-to-analog converter (DAC). The capacitive DAC can include binary-weighted capacitors. The capacitive DAC can include a bidirectional single-side (BSS) switching technique. The capacitive DAC can include redundant capacitors to recover errors originating from the comparator having a large comparator input common-mode variation.

The comparator can include a dynamic latch comparator. The comparator can include a p-type metal-oxide-semiconductor (PMOS) input pair.

The SAR logic can include one or more shift registers. The multi-bit SAR ADC can include complementary metal-oxide-semiconductor (CMOS) technology. The multi-bit SAR ADC can include bottom-plate sampling to sample the input voltage. The multi-bit SAR ADC can include n-type metal-oxide-semiconductor (NMOS) transistors to sample the input voltage.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems:

FIG. 3A shows a clock booster; FIG. 3B shows a comparator; and FIG. 3C illustrates a timing diagram used in an example SAR ADC in accordance with the disclosure.

DETAILED DESCRIPTION

Figure 1:
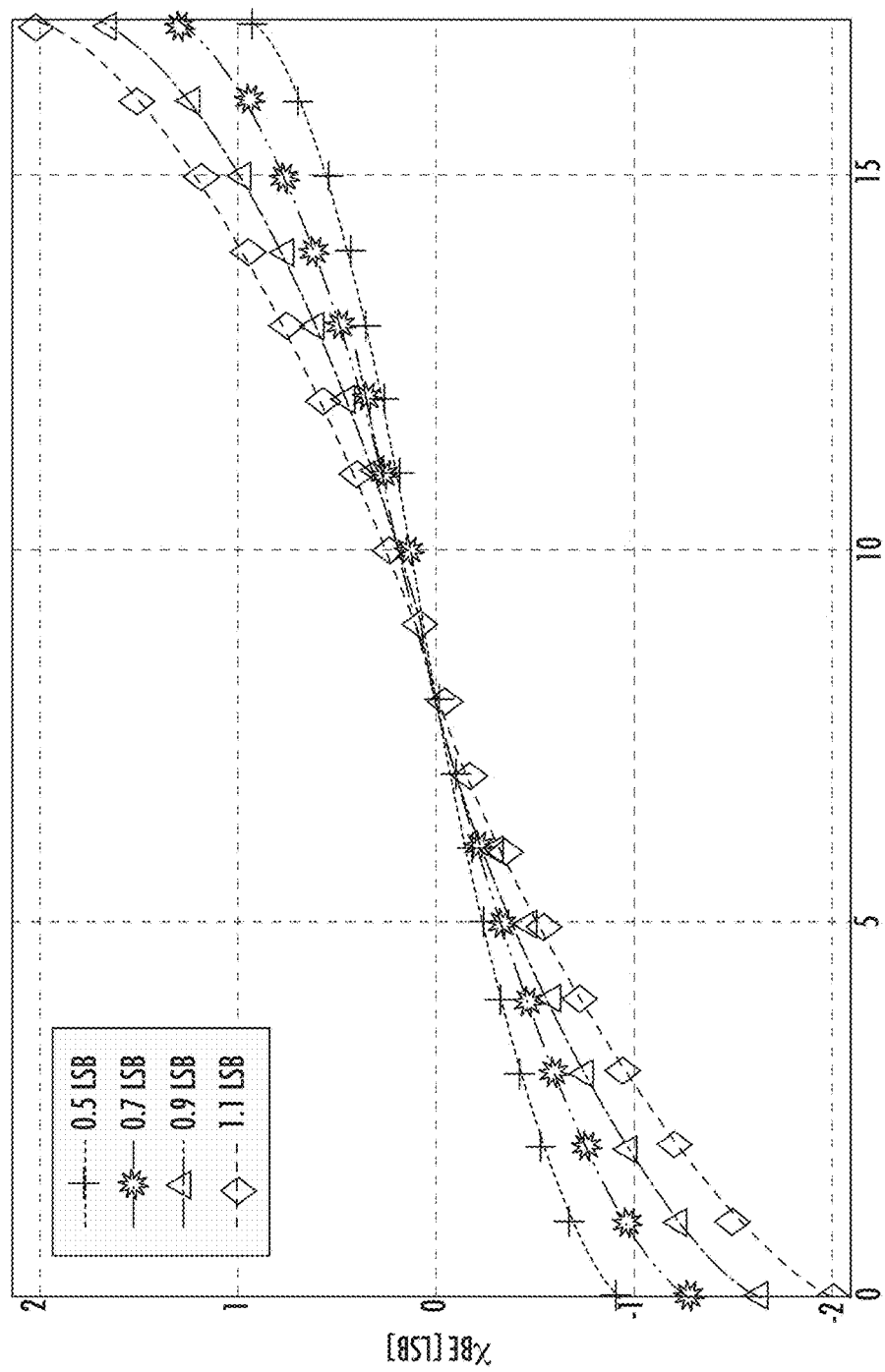
FIG. 1 shows a statistical estimator, $\hat{x}_{BE}(k)$, for different comparator noise values, $\sigma$, used in the context of an aspect of the disclosure.

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Embodiments of the methods and systems can be described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Disclosed herein are systems and methods that describe statistical estimation based noise reduction for SAR ADCs. For SAR ADCs, the conversion error can be available at the comparator input. Although a noisy 1-bit comparator may not be able to produce an accurate estimation for its input if used only once, the comparison can be repeated multiple times for a designated bit of the multi-bit SAR ADC. This can allow for the improvement of the estimation accuracy by examining the probability of the comparator output being "1" or "0". The estimation of a signal from a noisy environment using multiple trials can be cast as a classic statistical estimation issue. In one aspect of the disclosure, an optimal Bayes estimator is disclosed to achieve a low estimation error from the comparator on a designated bit of the multi-nit SAR ADC.

For SAR ADCs, the relationship between $V_{in}$ and $D_{out}$ can be written as:

$$D_{out} = V_{in} + n_s + x \quad (1)$$

where $n_s$ can denote the sampling kT/C noise which is directly added to the input, and x can represent the conversion residue due to both quantization error and comparator noise. If the comparator is noise free, x can be the quantization error bounded by +½ LSB and −½ LSB. However, in the presence of large comparator noise, x can have a Gaussian distribution with standard deviation close to the comparator noise. The noise of a SAR ADC can be dominated not by $n_s$ but rather by x. To reduce x, the conventional approach can be to use a low-noise comparator and a high-resolution DAC; however, that approach can require large power and area budgets.

In one aspect of the disclosure, a simpler and more power efficient way to reduce noise is described. If an accurate estimator for x can be determined, denoted as $\hat{x}$, the ADC resolution can be increased by subtracting $\hat{x}$ from $D_{out}$ as follows:

$$D_{out}^* = D_{out} - \hat{x} = V_{in} + n_s + (x - \hat{x}) \quad (2)$$

This shows that the resolution of $D_{out}^*$ can only limited by $n_s$ and the estimation error. It can, moreover, surpass the limit set by the quantization error if $\hat{x}$ is close to x.

One property for SAR ADCs can be that its conversion residue x can be readily available at the comparator input after the designated bit (e.g. the LSB) comparison. The designated bit can refer to any bit of the multi-bit SAR ADC. Thus, the comparator can be directly used to estimate x. The comparator may only be able to provide binary decisions and its output can be error-prone due to noise. As such, a one-time comparison may be inadequate, but the designated bit (e.g. the LSB) comparison can be repeated for a total of N times. Thereby x can be estimated by examining the number of "1"s, denoted as k. For example, if k=N, x can have a large positive value; if k=0, x may most likely have a large negative value; and if k=N/2, x may have a highly probablility of being close to 0.

The estimation of an unknown variable from noisy experiments can be considered a classic statistical estimation problem. There can be many ways to form $\hat{x}$. One method is to use basic averaging and thereby set v=(2k −N)/N. However, this method can suffer from a large estimation error. An estimator with small error can be the Bayes estimator, defined as:

$$\hat{x}_{BE}(k) = E(x|k) = \int_{-\infty}^{+\infty} x g(x|k) dx \quad (3)$$

where g(x|k) can refer to the posterior probability density function:

$$g(x|k) = \frac{p(k|x)g(x)}{\int_{-\infty}^{+\infty} p(k|x)g(x)dx} g(x|k) = \frac{p(k|x)g(x)}{\int_{-\infty}^{+\infty} p(k|x)g(x)dx} \quad (4)$$

where P(k|x) can refer to the probability of k conditioning on x, and g(x) can refer to the prior distribution of x. Equations (3) and (4) may be computationally intensive to calculate. The equations may only need to be solved for once and the results can be stored in a look-up table. This way, once a k is known, $\hat{x}_{BE}$ can be directly obtained from the table.

For each bit of the multi-bit output of the SAR ADC, one or more comparators can compare an input voltage to a reference voltage as part of a process to determine a value for the output bit. The multi-bit output can be, for example, a four bit, an eight bit, a sixteen bit, a thirty-two bit, a sixty four bit, or a one-hundred and twenty eight bit, or any other number of bit output SAR ADC. Each output bit can have a corresponding reference voltage. For the designated bits of the multi-bit output, the comparators can compare the input voltage to the designated bit's corresponding reference voltage. The comparison can occur a pre-determined number of times during a number of clock cycles generated by one or more clock generators. Each comparison can generate either a value of either "0" or a "1", and the counters can keep count of the number of "0" or "1" values generated during the clock cycles associated with the designated bit. The count information can be stored in memory.

The memory can be built from multiple registers, and can be part of the SAR logic. The SAR logic can perform statistical analysis on the count of the number of the "0" and "1" values generated during the clock cycles for any and all designated bits. This statistical analysis can be used to determine a final value of the designated bit(s) of the multi-bit output. Moreover, various aspects of the disclosed systems and methods can be implemented on an ASIC, FPGA, microprocessor, or the like.

FIG. 1 shows $\hat{x}_{BE}$ for an example SAR ADC having N=17. To calculate $\hat{x}_{BE}$, a knowledge of the comparator noise may be necessary. The comparator noise can be measured, for example, from the standard deviation of $D_{out}$ by setting $V_{in}$=0. It can also be extracted from circuit simulations, for example, from a Simulation Program with Integrated Circuit Emphasis (SPICE) simulation.

As in any noise reduction scheme, there can be power usage constraints. For the disclosed systems and methods, the total power of the comparator can increase, for example, due to the extra number of designated bit (e.g. LSB) comparisons. To reduce the total noise in the 11-bit ADC by approximately 7 dB, the LSB comparison may need to be fired approximately 17 times. This can result in an increase of total comparator power by approximately $(11+17)/11 \approx 2.5$ times. If a brute-force way to reduce comparator noise is implemented by increasing its size and power, the comparator power may need to be increased by approximately 21 times in order to obtain the same amount of noise reduction for the same 11-bit ADC. Thus, the disclosed system and methods are more power efficient. One tradeoff for the disclosed system and methods may be a reduced conversion rate due to increased number of designated bit (e.g. LSB) comparisons. In one aspect, therefore, the disclosed systems and methods may be more suitable for low-to-medium speed applications.

Example

The following example(s) are put forth so as to provide those of ordinary skill in the art with a complete disclosure and description of how the compounds, compositions, articles, devices and/or methods claimed herein are made and evaluated, and are intended to be purely exemplary and are not intended to limit the scope of the methods and systems. Efforts have been made to ensure accuracy with respect to numbers (e.g., amounts, voltages, etc.), but some errors and deviations should be accounted for.

As a non-limiting example, a SAR ADC can be implemented in approximately 65 nm CMOS. Using the disclosed system and methods, the measured SNR can be improved by approximately 7 dB, which matches well with theoretical predictions. Overall, the SAR ADC can achieve an ENOB of approximately 10.5-bit at approximately 100 kS/s while consuming approximately 645 nW power from an approximately 0.7 V supply.

Circuit Implementation

Figure 2:
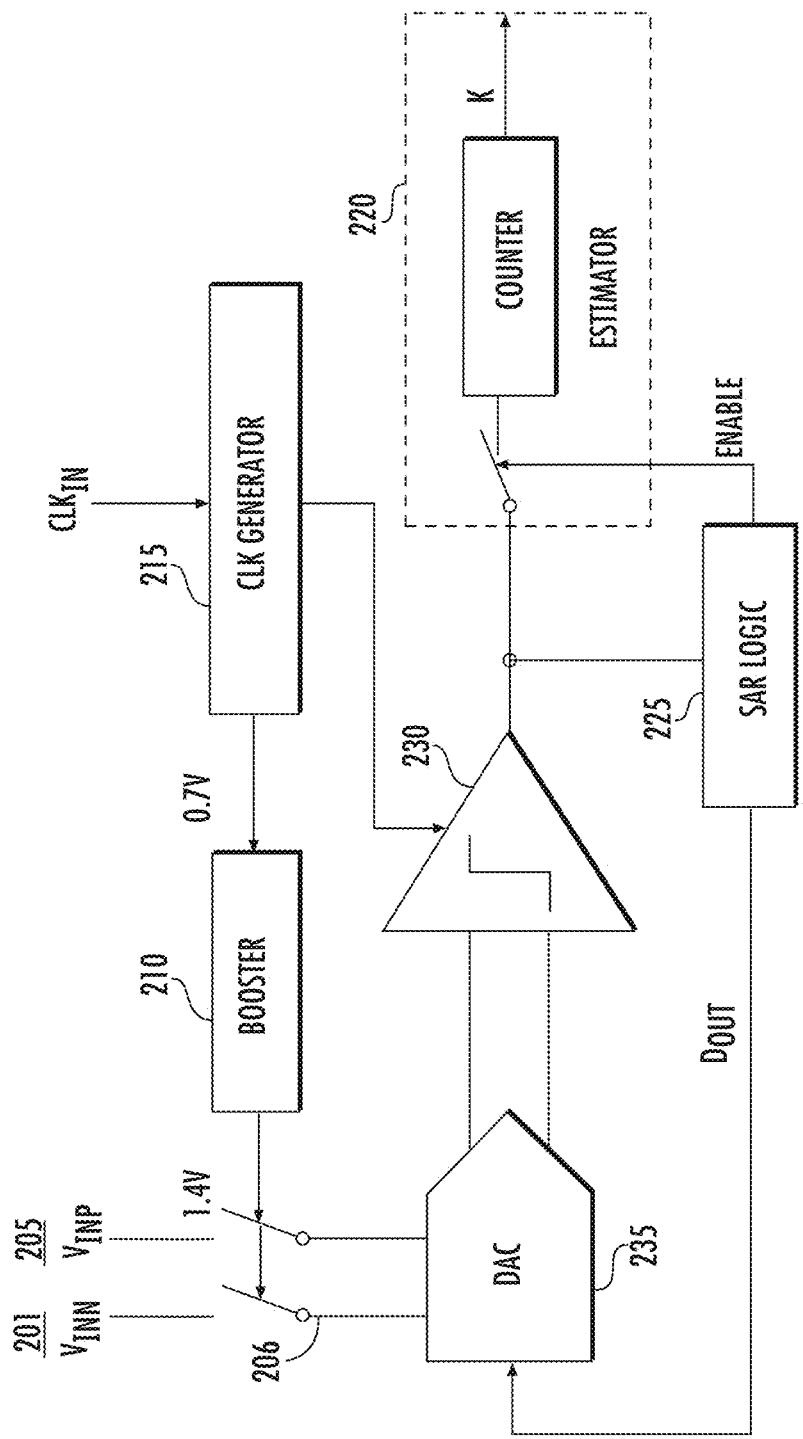
FIG. 2 shows an example implementation of the SAR ADC architecture.

FIG. 2 shows an example SAR ADC architecture in accordance with the disclosed systems and methods. The analog input voltage (205, positive input voltage, $V_{inp}$, and 201, negative input voltage, $V_{inn}$) can be held on a sample/hold circuit 205. The clock generator 215 can comprise a circuit that produces a timing signal for use in synchronizing the operation of the various elements of the SAR ADC. Moreover clock cycles can be generated by the clock generator 215, which can, in various implementations, be controlled by a master (e.g. $clk_{in}$) clock signal. In some implementations, a clock booster 210 can be employed to double the master clock voltage ($clk_{in}$) from approximately 0.7 V to approximately 1.4 V.

SAR logic 225 comprising, for example, an N-bit register, can be first set to midscale (e.g., "100 . . . 00", where the most-significant-bit, MSB, is set to "1"). The SAR logic can be built, for example, by standard shift registers. This can make the DAC 235 output voltage to be set to half the reference voltage $V_{REF}$ (i.e. $V_{REF}/2$). $V_{REF}$ can refer to the reference voltage (not shown) provided to the SAR ADC, or in various implementations, the reference voltage provided to the DAC. A comparison can then be performed by the comparator 230 to determine if the analog input voltage (205 and 201) is less than, or greater than, the outputted voltage of the DAC 235. If the analog input voltage (205 and 201) is greater than the output voltage of the DAC 235, the comparator 230 output can be a logic high, or "1", and the MSB of the N-bit register in the SAR logic 225 can remain at a value of "1". Conversely, if the input voltage (201 and 205) is less than the output voltage of the DAC 235, the comparator 230's output can be a logic low, or "0", and the MSB of the register in the SAR logic 225 can be cleared to logic "0". The SAR logic 225 can then move to the next bit after the MSB, can force that bit high, and perform another comparison at the comparator 230. The sequence can continue all the way down to the LSB. Once this is done, the conversion is complete and the N-bit digital word is available in the register in the SAR logic 225.

In one aspect of the implementation, in conjunction with "normal" SAR ADC operation for a designated bit (i.e. as described in the preceding description) of the multi-bit SAR ADC, a counter can be enabled as shown in FIG. 2. The counter can record the number of "1"s or "0"s during, the designated bit's (e.g. the LSB's) comparisons and can obtain k for statistical estimation. Thus, in one implementaiton, the changes to conventional SAR ADC operations can be that: 1) one or more clock generators can be added and modified to repeat any designated bit's (e.g. the LSB's) comparison a pre-determined number of times (approximately 17 times in the current example); and 2) a counter (5 bits in the current example) can be used to count the number of "1"s or "0"s to obtain k. In some implementations, a portion, up to and including the entirety of the bits, can be designated for statistical analysis and multiple measurement.

Capacitive DAC

In one implementation, the DAC can comprise binary-weighted capacitors. The unit capacitor, $C_U$ (not shown), of the binary-weighted capacitors can be minimized to save power. Considering noise and matching requirements, this design can choose, for example, a $C_U$=2 fF (approximate), which can be the smallest metal-oxide-metal (MOM) capacitor provided in the process design kit (PDK). Moreover, a bidirectional single-side (BSS) switching technique can be adopted to further reduce the DAC reference power. In some implementations, the reference power reduction can be up to and including approximately 86% compared to conventional switching schemes. The BSS can reduce the number of unit capacitors by approximately 4 times, leading to a small capacitor array of, for example, {256, 128, 64, 32, 16, 16, 8, 4, 2, 1, 1} $C_U$ for an 11-bit ADC. A redundant capacitor 16 $C_U$ can be provided to recover possible errors during the first several MSB comparisons with large comparator input common-mode variation. The differential sampling kT/C noise can be approximately 88 μV.

Input Sampling Circuit

In one aspect, to ensure good sampling linearity, bottom-plate sampling can be used. In addition, a clock booster shown in FIG. 3(a) can be employed to double the sampling clock voltage from approximately 0.7 V to approximately 1.4 V. As a result, n-type metal-oxide-semiconductor (NMOS) transistors can be used to sample $V_{in}$ instead of an array of bootstrapped switches or large complementary metal-oxide-semiconductor (CMOS) switches. This can lead to a reduction of the design complexity and switch driving power.

Dynamic Latch Comparator with Noise Reduction Technique

FIG. 3(b) shows the dynamic comparator that can be used in example implementations. The dynamic comparator can use a PMOS input pair to minimize flicker noise and substrate coupling. With the disclosed noise reduction systems and methods, the comparator thermal noise requirement can be relaxed, leading to substantially reduced comparator power. In example implementations, the simulated overall input referred comparator root-mean-square (RMS) noise can be approximately 490 µV or approximately 0.72 LSB.

Clock Generation and SAR Logic

An SAR ADC timing diagram for example implementations is shown in FIG. 3(c). The SAR ADC can use a synchronous clocking scheme. The frequency of the master clock can be approximately 32 times faster than the sampling rate. The first approximately 4 clock cycles can be used for input sampling to ensure high sampling accuracy; the subsequent approximately 11 cycles can be used for normal SAR operation; and the final approximately 17 cycles can be used for repeated designated bit (e.g. LSB) comparisons. This clock allocation scheme can be implemented, for example, using a ripple counter-based clock divider and several AND gates.

As mentioned, in example implementations, the SAR logic can be built from standard shift registers. When normal SAR operation finishes and the last shift register makes transition, a counter can be enabled as shown in FIG. 2. It can record the number of "1"s during the designated bit's (e.g. the LSB's) comparisons and can obtain k for statistical estimation.

Measured Results

Figure 4:
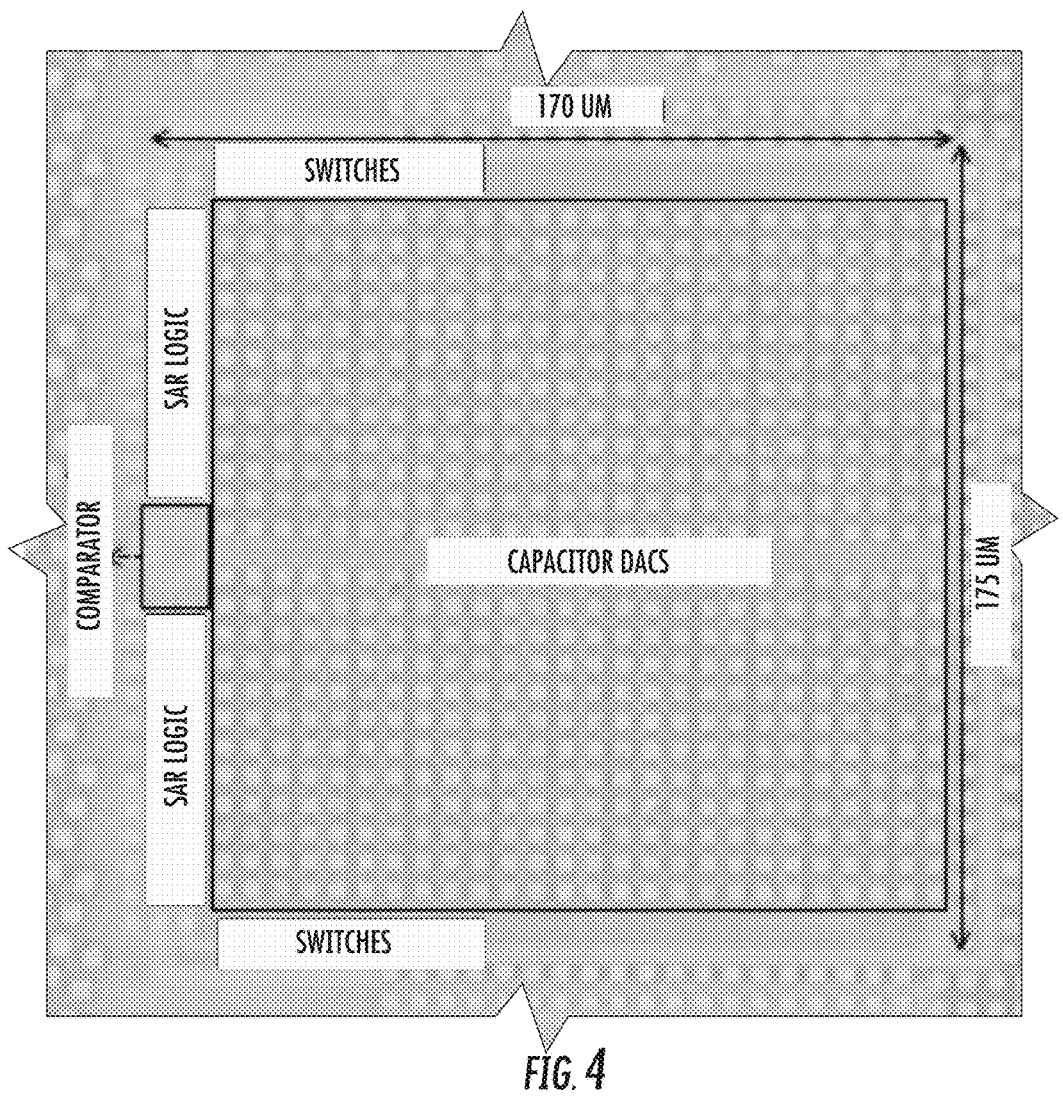
FIG. 4 shows a die micrograph of an example implementation of an SAR ADC in accordance with the disclosure.

In one aspect of the disclosure, a prototype SAR ADC in approximately 65 nm CMOS can be fabricated. The CMOS prototype can occupy an active area of approximately 0.03 mm$^2$, dominated by the DAC (see FIG. 4).

Figure 5:
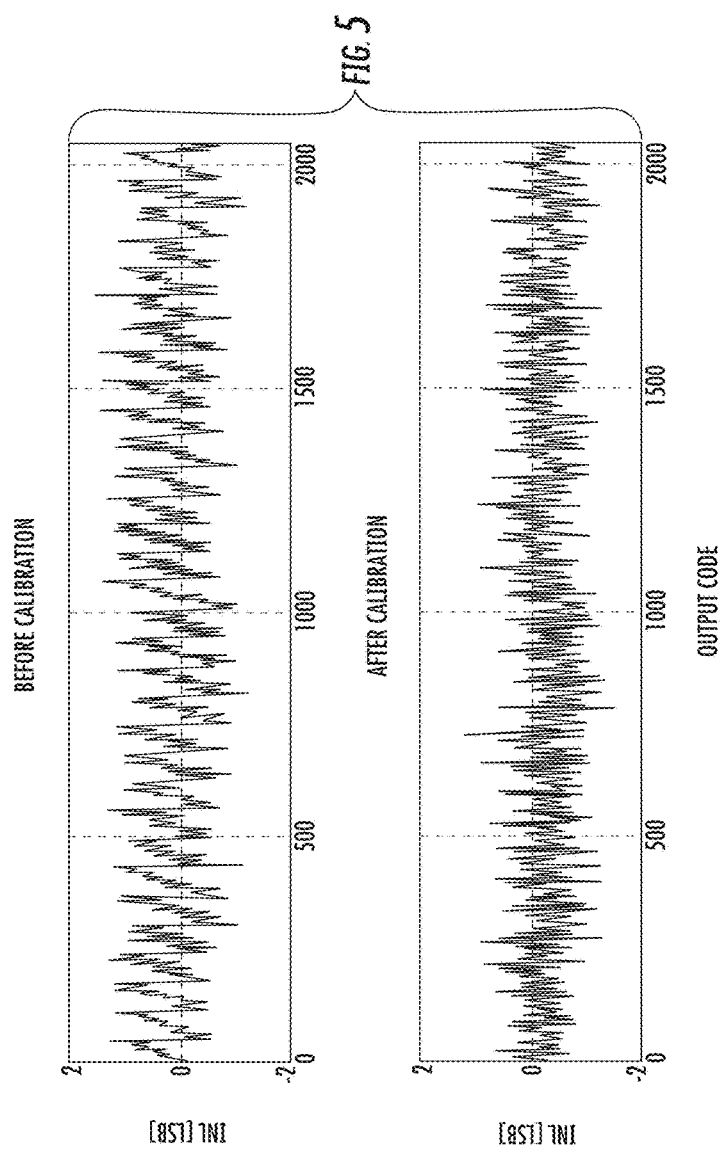
FIG. 5 shows the measured integral non-linearity (INL) of the example implementation of the SAR ADC, before and after capacitor calibration.

The measured integral nonlinearity (INL) can be approximately +1.57/−1.23 LSB and is shown in FIG. 5. In an example implementation, there can be a 1-LSB systematic mismatch between the MSB capacitors and the LSB capacitors, which can arise from the unmatched surrounding environment. This unmatched surrounding environment can be due to a segmented layout strategy and inaccurate parasitic extraction. A simple foreground calibration can be performed and the appreciable periodic transition pattern can disappear after calibration.

Figure 6:
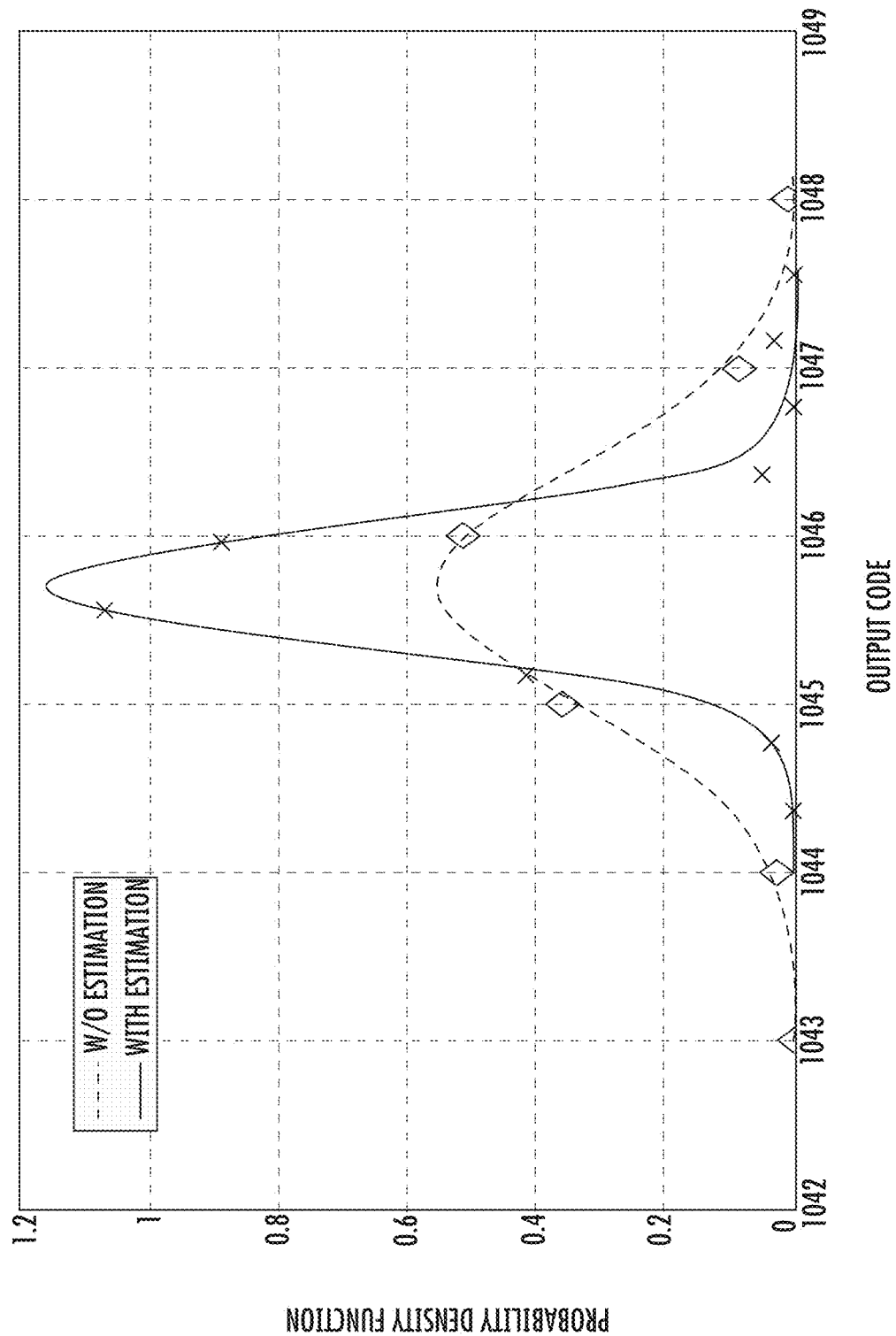
FIG. 6 shows the Dout distribution at $V_{in}=0$ for the example implementation of the SAR ADC, with and without the use of the disclosed statistical analysis.

To verify aspects of the disclosed noise reduction systems and methods, the SAR ADC noise (e.g., the variation of $D_{out}$) at $V_{in}=0$ can be first measured. The measured probability densities for $D_{out}$ before and after noise reduction are shown in FIG. 6 together with fitted normal distributions. Before noise reduction, the standard deviation of $D_{out}$ is approximately 0.73 LSB. This can indicate that the comparator input referred noise is about 500 µV, which is in agreement with SPICE simulations. After noise reduction, the standard deviation of $D_{out}$ can be reduced by approximately 7 dB to approximately 0.33 LSB, which matches with the results from estimation theory. Note that if conventional design approaches are used, the comparator noise may need to be reduced to approximately 0.16 LSB in order for the total ADC noise to be approximately 0.33 LSB, which also includes the approximately 0.29 LSB quantization error. This can mean that the total comparator power may need to be increased by approximately 21 times. By contrast, in the disclosed noise reduction systems and methods, the total comparator power may only be increased by approximately 2.5 times, showing their improved power efficiency.

Figure 7:
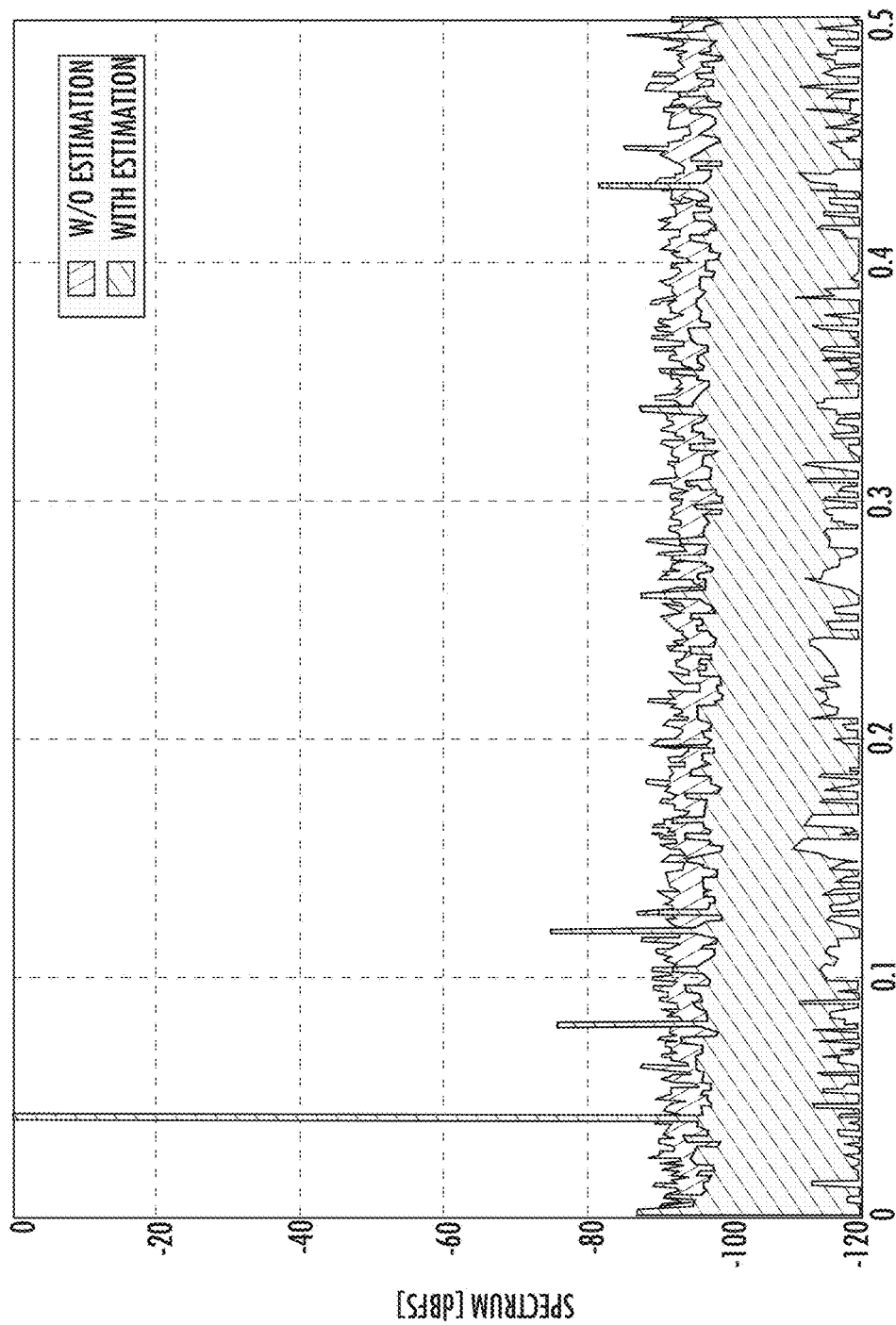
FIG. 7 show the measured SAR ADC output spectra with $2^{14}$ points for the example SAR ADC.

FIG. 7 shows the measured spectrum for an approximately 96 kHz full-scale input to the SAR ADC sampled at approximately 100 kS/s. One reason for not choosing a low frequency input can be that the low-distortion band-pass filter used (not shown) has a cut-off frequency at approximately 90 kHz. The measured signal-to-noise and distortion ratio (SNDR) and the signal-to-noise ratio (SNR) are approximately 59.4 and approximately 59.7 dB, respectively. After applying the disclosed noise reduction systems and methods, the SNDR and SNR can be improved to approximately 64.5 dB and approximately 65 dB, respectively. The corresponding ENOB is approximately 10.5-bit.

Figure 8:
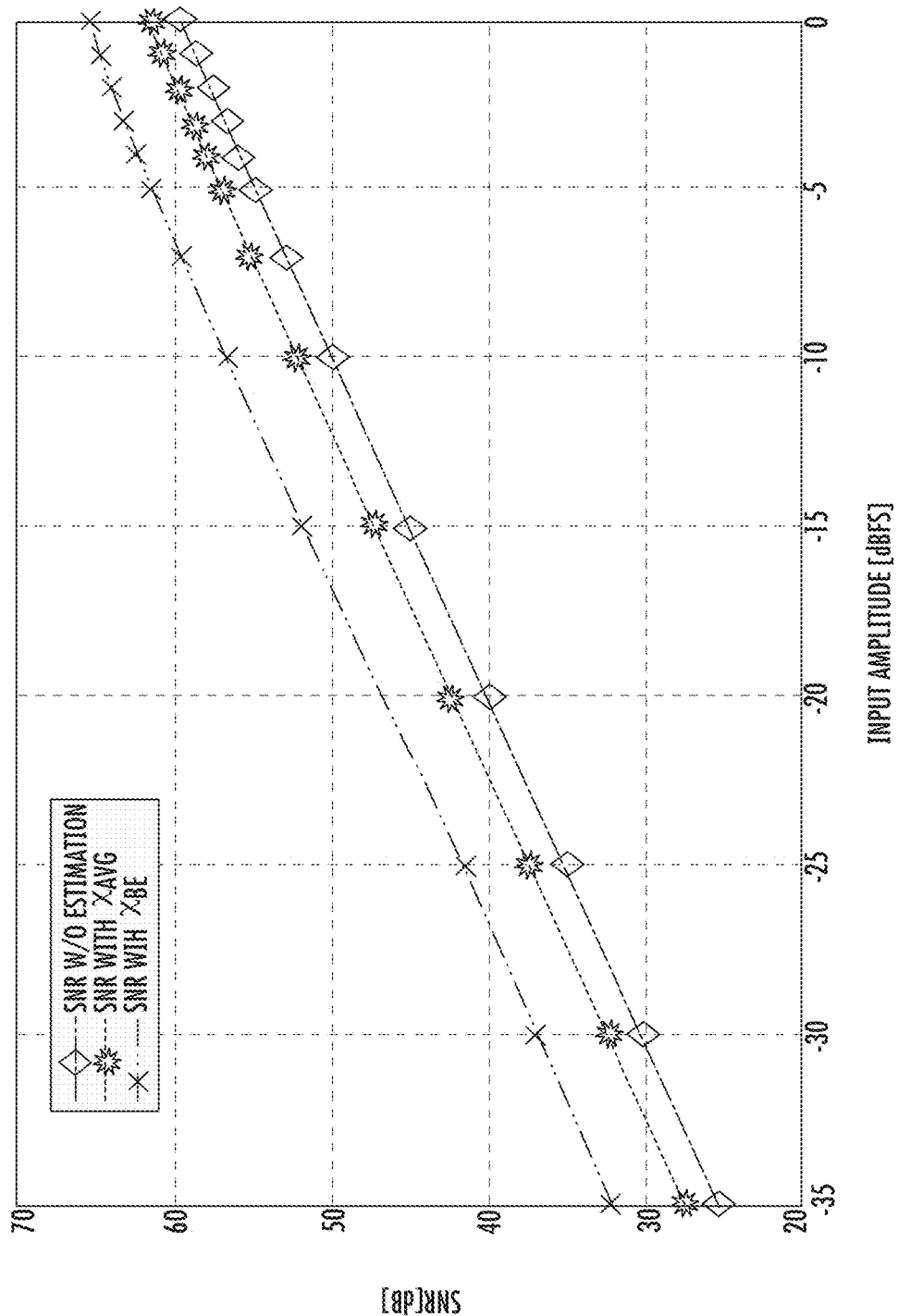
FIG. 8 shows the measured SNR versus input amplitudes.

FIG. 8 shows the SNR with varying input amplitudes to the SAR ADC. The SNR improvement using a simple averaging based estimator $\hat{x}_{avg}$ is limited to approximately 2.2 dB. By contrast, by using the Bayes estimator, $\hat{x}_{BE}$, the SNR can be improved by approximately 7 dB. When the input is large, the SNR improvement can decrease slightly to approximately 5.3 dB. This can be caused by the unwanted coupling from the input to the reference lines, which can be discovered during the taking of measurements. However, such SNR loss can be recovered by optimizing the SAR ADC CMOS layout to reduce the coupling.

The example SAR ADC can consume approximately 645 nW from an approximately 0.7 V power supply. The comparator, DAC, clock generator, and SAR logic consume approximately 70 nW, approximately 102 nW, approximately 193 nW and approximately 280 nW, respectively. When implementing the disclosed noise reduction systems and methods, the comparator power can account for only approximately 10% of the total power for a 10.5-bit ENOB. In the example, the digital power, including both clock generator and SAR logic, dominates the overall SAR ADC power. The digital power can be reduced further thorough optimization and/or going to a more advanced technology, without affecting the SNR. The measured figure-of-merit (FOM) for the example SAR ADC is approximately 4.5 fJ/conversion-step. As shown in Table I, the performance of the proposal SAR ADC is comparable to other methods.

TABLE 1

Performance comparison

| | [1] | [2] | [3] | Present Disclosure |
|---|---|---|---|---|
| Process [nm] | 90 | 65 | 65 | 65 |
| Supply Voltage [V] | 0.35 | 0.8 | 0.6 | 0.7 |
| Sampling Rate [kS/s] | 100 | 32 | 40 | 100 |
| Resolution [bit] | 10 | 12 | 12 | 11 |
| ENOB [bit] | 9.05 | 11 | 10.1 | 10.5 |
| Power [nW] | 170 | 310 | 97 | 645 |
| FOM [fJ/conv-step] | 3.2 | 4.8 | 2.2 | 4.5 |

[1] H.-Y. Tai, H.-W. Chen, and H.-S. Chen, "A 3.2fJ/c.-s. 0.35 V 10 b 100 kS/s SAR ADC in 90 nm CMOS," IEEE VLSI Symp., 2012, pp. 92-93, incorporated by reference herein.
[2] P. Harpe, E. Cantatore, and A. van Roermund, "An oversampled 12/14 b SAR ADC with noise reduction and linearity enhancements achieving up to 79.1 dB SNDR," IEEE ISSCC, 2014, pp. 194-195, incorportaed by reference herein.
[3] P. Harpe, E. Cantatore, and A. van Roermund, "A 10 b/12 b 40 kS/s SAR ADC with data-driven noise reduction achieving up to 10.1 b ENOB at 2.2 fJ/conversion-step," IEEE JSSC, vol. 48, pp. 3011-3018, December 2013, incorportaed by reference herein.

Conclusion

Disclosed herein are systems and methods that describe noise reduction for SAR ADC based on statistical estimation. The disclosed systems and methods have the advantage of being simple to use and power efficient. They can have many applications, for example, in electronics those that require low-power and/or high-resolution ADCs.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications are referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A multi-bit output successive approximation register (SAR) analog-to-digital converter (ADC) comprising:
    at least one comparator;
    at least one clock generator; and
    SAR logic comprising only one counter and memory, wherein for each bit of a multi-bit output, the at least one comparator compares an input voltage to a reference voltage to determine a value for the output bit, each output bit having a corresponding reference voltage;
    wherein for at least one designated bit of the multi-bit output, the at least one comparator compares the input voltage to the designated bit's corresponding reference voltage a plurality of times during a plurality of clock cycles generated by the at least one clock generator, each comparison generating either a value of either "0" or a "1", the counter keeps count of the number of at least one of the "0" or "1" values generated during the plurality of clock cycles, said count stored in the memory;
    wherein the SAR logic performs statistical analysis on the count of the number of the at least one of the "0" and "1" values generated during the clock cycles to determine a final value of the at least one designated bit of the multi-bit output.

2. The multi-bit SAR ADC of claim 1, wherein the statistical analysis comprises Bayes estimation.

3. The multi-bit SAR ADC of claim 2, wherein the Bayes estimation comprises a calculation of a posterior probability density function of a conversion residue.

4. The multi-bit SAR ADC of claim 1, wherein the clock generator generates a master clock that is faster than a sampling rate of the SAR ADC.

5. The multi-bit SAR ADC of claim 1, wherein the multi-bit SAR ADC further comprises a capacitive digital-to-analog converter (DAC).

6. The multi-bit SAR ADC of claim 1, wherein the comparator comprises a dynamic latch comparator.

7. The multi-bit SAR ADC of claim 1, wherein the comparator comprises a p-type metal-oxide-semiconductor (PMOS) input pair.

8. The multi-bit SAR ADC of claim 1, wherein the multi-bit SAR ADC implements a synchronous clocking scheme.

9. The multi-bit SAR ADC of claim 1, wherein the multi-bit SAR ADC comprises bottom-plate sampling to sample the input voltage.

10. The multi-bit SAR ADC of claim 1, wherein the multi-bit SAR ADC comprises n-type metal-oxide-semiconductor (NMOS) transistors to sample the input voltage.

11. A method for converting an analog signal to a digital signal using a multi-bit output successive approximation register (SAR) analog-to-digital converter (ADC), the method comprising:
    comparing, for each bit of a multi-bit output, an input voltage to a reference voltage to determine a value for an output bit, wherein each output bit has a corresponding reference voltage;
    comparing, for at least one designated bit of the multi-bit output, the input voltage to the designated bit's corresponding reference voltage a plurality of times during a plurality of clock cycles generated by at least one clock generator, wherein each comparison generates either a value of either "0" or a "1";
    keeping count of the number of at least one of the "0" or "1" values generated during the clock cycles;
    performing statistical analysis on the count of the number of the at least one of the "0" and "1" values generated during the clock cycles to determine a final value of the at least one designated bit of the multi-bit output, wherein the statistical analysis comprises Bayes estimation.

12. The method of claim 11, wherein the Bayes estimation comprises a calculation of a posterior probability density function of a conversion residue.

13. The method of claim 11, wherein the Bayes estimation is performed using a look-up table.

14. The method of claim 11, wherein the multi-bit SAR ADC further comprises a capacitive digital-to-analog converter (DAC).

15. The method of claim 11, wherein the comparison is performed by at least one comparator and the capacitive DAC comprises redundant capacitors to recover errors originating from the comparator having a large comparator input common-mode variation.

16. The method of claim 15, wherein the comparator comprises a dynamic latch comparator.

17. The method of claim 15, wherein the comparator comprises a p-type metal-oxide-semiconductor (PMOS) input pair.

18. The method of claim 11, wherein the multi-bit SAR ADC comprises bottom-plate sampling to sample in the input voltage.

19. The method of claim 11, wherein the multi-bit SAR ADC comprises n-type metal-oxide-semiconductor (NMOS) transistors to sample the input voltage.

20. The method of claim 11, wherein keeping count and performing statistical analysis on the count is performed using a single counter.

* * * * *